United States Patent [19]

Milkovic

[11] Patent Number: 4,492,919
[45] Date of Patent: Jan. 8, 1985

[54] CURRENT SENSORS
[75] Inventor: Miran Milkovic, Scotia, N.Y.
[73] Assignee: General Electric Company, Schenectady, N.Y.
[21] Appl. No.: 367,315
[22] Filed: Apr. 12, 1982
[51] Int. Cl.³ .......................... G01R 1/20; H01F 40/06
[52] U.S. Cl. ...................................... 324/127; 323/357
[58] Field of Search ................ 324/127, 126; 328/162, 328/163; 338/49; 323/357

[56] References Cited

U.S. PATENT DOCUMENTS 2,915,707 12/1959 Bradstock et al. ................... 324/127
3,815,012 6/1974 Milkovic ................................ 323/6
4,182,982 1/1980 Wolf et al. ............................ 324/127

Primary Examiner—Ernest F. Karlsen
Attorney, Agent, or Firm—Geoffrey H. Krauss; James C. Davis, Jr; Marvin Snyder

[57] ABSTRACT

A sensor for measuring large magnitudes of A.C. current utilizes a conductive member having a higher-resistance element parallelled by a pair of elements with lower, and substantially equal, resistance and so arranged as to cause cancellation of magnetic field effects upon the higher-resistance element due to a flow of current through the lower-resistance elements. Thermal-effect compensation of the higher-resistance element of the sensor is also disclosed. Active load termination of a current-sensing transformer, positioned about the higher-resistance element, is used.

15 Claims, 4 Drawing Figures

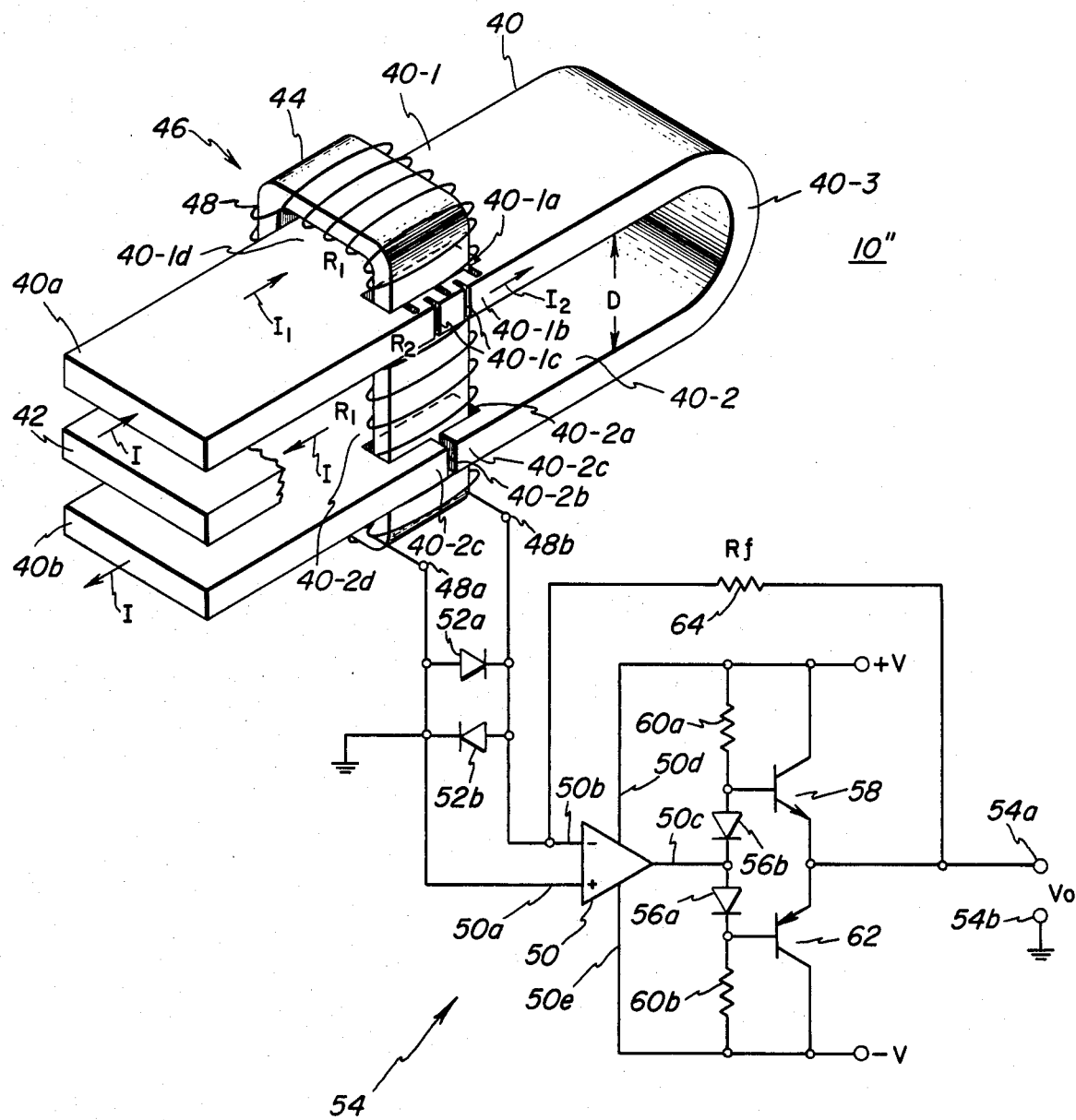

4,492,919

CURRENT SENSORS

BACKGROUND OF THE INVENTION

The present application concerns apparatus for sensing the magnitude of AC current flow and, more particularly, concerns novel current sensors utilizing split-conductor configurations and compensating for magnetic field and/or thermal effects.

Large magnitudes of alternating current flow are often measured by utilizing a current divider to split the current flow, whereby a reduced magnitude current is caused to flow in a shunting sensor branch. The reduced-magnitude current is sensed, through a current transformer, by an active load circuit. One such current-sensing transducer is described in U.S. Pat. No. 4,182,982 to J. E. Wolf et al., issued Jan. 8, 1980. This transducer 1 (shown in FIG. 1) utilizes a conductive member 2 having a main portion 2a through which flows a first current $I_1$, which is a substantial portion of the total current I to be measured. A second current portion $I_2$ flows through a second branch 2b of the transducer. It will be seen that, because the voltages across parallel portions 2a and 2b are equal, the ratio of portion resistances $R_1$ and $R_2$ should establish the ratio of currents $I_1$ and $I_2$ flowing in first and second portions 2a and 2b. However, current $I_1$ causes a magnetic field $B_1$ to be generated, which magnetic field induces an additional current $I_B$ in conductor portion 2b. While the current $I_2$ flowing portion 2b also induces a current in portion 2a, as the ratio of currents $I_1$ to $I_2$ is generally large, e.g. greater than 10:1, the greatest effect is noted in the current $I_2 + I_b$ flowing through conductor portion 2b; this current $I_2 + I_b$ flows in the primary of a current transformer (not shown for purposes of simplicity) at the secondary winding of which is obtained an indication of the total current I flowing through transducer 1. The sensed load current is proportional to $I_B = KS(2\pi f)(I_1 - I_2)/R_2 \times \sin(2\pi f - 90°)$, where S is the area of the loop formed about sensor opening 2c, f is the frequency of the AC current to be measured, and K is a geometry constant. It will be seen that the induced loop current $I_B$ is thus 90° out-of-phase with the current $I_2$ to be measured. As both currents $I_2$ and $I_B$ add vectorially, the actual measured current can have a significant magnitude and phase error between the total current I and the desired branch current $I_2$.

Further, the prior art transducer 1 is prone to a self-heating effect which causes an increase in divider current $I_2$ at higher currents, due to the positive temperature coefficient of the main-path resistance $R_1$ and, therefore, increased power dissipation $P_1 = I_1^2 R_1$ in that resistance with increased current flow. That is, with the same voltage drop across portions 2a and 2b, the power dissipation in portion 2a will be greater than the power dissipation in portion 2b, and the relative power dissipations will cause the main-path resistance $R_1$ to increase more than the resistance of shunt-path resistance $R_2$, whereby $I_2$ increases proportionally with the square of the total transducer current I.

It is desirable to provide current sensors which have increased accuracy by removal of the effects of induced current and/or self-heating phenomena.

BRIEF SUMMARY OF THE INVENTION

In accordance with the invention, apparatus for sensing the magnitude of an AC current flowing therethrough, includes a member having a higher-resistance portion shunted by at least one of a pair of lower-resistance current-carrying elements, with the lower-resistance elements so arranged as to provide substantially equal magnitude and oppositely-phased induced currents in the higher-resistance member. The oppositely-phased induced currents cancel one another, whereby the current flowing in the higher-resistance element is in phase with the total current flowing in the sensor, and of magnitude established by the ratio of the resistance of at least one of the lower-resistance elements to the resistance of the higher-resistance element.

Thermal compensation for self-heating effects is provided by utilization of a somewhat U-shaped member, having the higher-resistance element formed in one arm thereof and having both arms so arranged as to transfer a portion of the heat energy dissipated in both arms to the higher resistance element, to maintain that element with a resistance which increases as the resistance of the shunting lower resistance element increases.

In presently preferred embodiments, the higher-resistance element is formed as an element having a meander-line path, fabricated within the same member as the pair of lower-resistance elements. The meander-line higher-resistance element forms a primary winding for a current transformer having an active load termination circuit connected to the secondary winding thereof, whereby a sensor output voltage proportional, with a high degree of magnitude and phase linearity, to the total current flowing to the sensor is achieved.

Accordingly, it is an object of the present invention to provide a current sensor compensated for self-induced magnetic field errors.

It is another object of the present invention to provide a current sensor compensating for self-heating errors induced by a flow of the measured current through the sensor.

These and other objects of the present invention will become apparent upon consideration of the following detailed description, when read in conjunction with the drawings.

BRIEF DESCRIPTION OF THE DRAWINGS

FIG. 2b is a perspective view of another presently preferred embodiment of the current sensor of the present invention, illustrating compensation for self-heating thermal effects, and of another active load terminating circuit for use therewith.

DETAILED DESCRIPTION OF THE INVENTION

Figure 1:
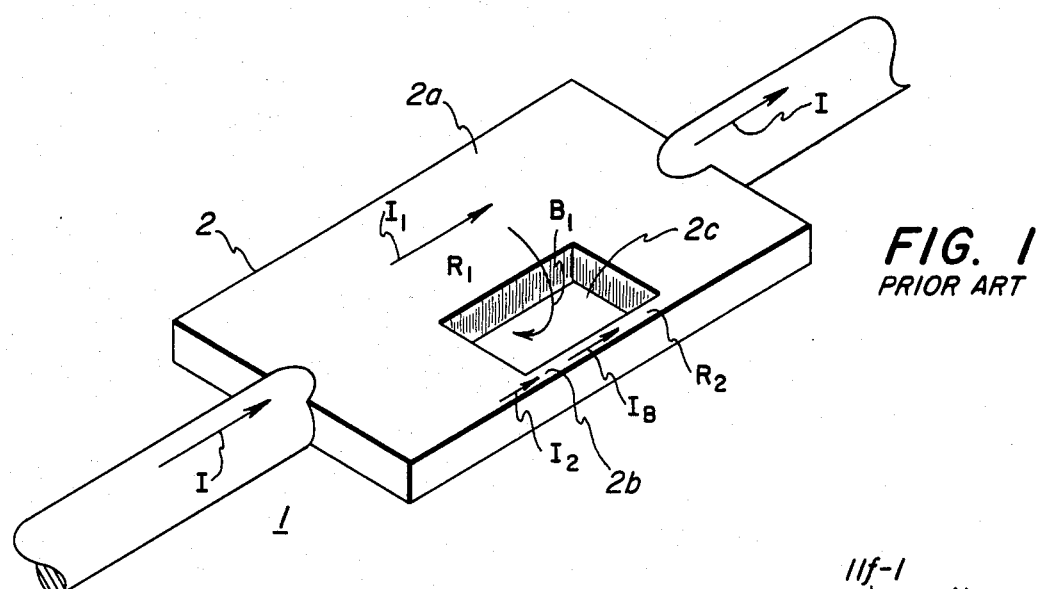
FIG. 1 is a perspective view of a prior art current sensing transducer.
Figure 2:
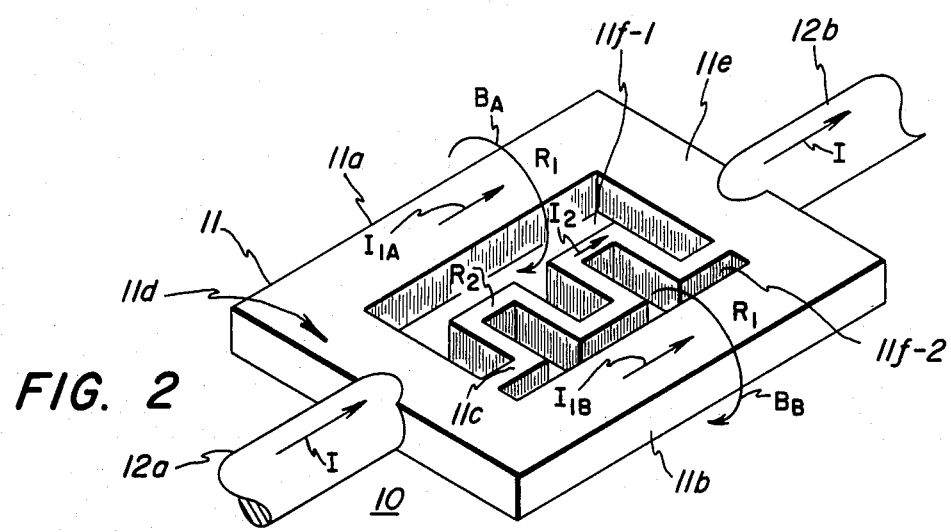
FIG. 2 is a perspective view of a first embodiment of novel current sensor in accordance with the principles of the present invention.

Having previously referred to FIG. 1 for an explanation of the induced magnetic field and thermal errors which may occur in a prior art current sensing transducer, reference is now made to a first embodiment 10 of my novel current sensor, shown in FIG. 2. Current sensor 10 utilizes a member 11 of a conductive material, such as copper and the like. Member 11 is placed between first and second current-carrying conductor portions 12a and 12b, whereby an AC current of relatively large magnitude I flows into and out of member 11. In accordance with the invention, member 11 is formed into first and second element portions 11a and 11b, each having a lower resistance of magnitude $R_1$, for conducting substantially equal currents $I_{1A}$ and $I_{1B}$, from conductor portion 12a to conductor portion 12b, and vice versa. Another current-carrying element portion 11c is formed in member 11, between portions 11a and 11b. Element 11c is so formed, partially by the size and shape of apertures 11f, as to have a resistance $R_2$ of magnitude substantially greater than the substantially equal resistances $R_1$ of element portions 11a or 11b, such that the current $I_2$ flowing through element 11c is a reduced representation of the total current I flowing through sensor 10. The reduced-magnitude current $I_2$ in the higher-resistance branch element 11c has a relation to the total sensor current I given by:

$$I_2 = I/(1 + 2R_2/R_1) = KI,$$

where $K = 1/(1 + 2R_2/R_1)$.

In order to obtain $R_2/R_1$ ratios up to about 50:1, the resistance $R_2$ is increased by forming element 11c with a meander-line geometry, whereby the total length of the path through which current $I_2$ flows, from first member common end portion 11d to second member common end portion 11e, is much longer than the length of either portion 11a or 11b. The increased length of element 11c, in conjunction with the reduced cross-sectional area thereof (relative to the cross-sectional area of either portion 11a or 11b), provides element 11c with a resistance $R_2$ much greater than either main-branch-element resistance $R_1$.

Sensing-branch element 11c is so positioned between main-branch elements 11a and 11b that the magnetic field $B_A$ or $B_B$ induced by the flow of main-branch currents $I_{1A}$ or $I_{1B}$ both cut the sensor-branch element 11c and induce equal, but oppositely phased, currents therein. The induced currents substantially cancel, whereby the total current flowing through sensor-branch element 11c is substantially the current $I_2$, of magnitude established by the ratio of resistance $R_2$ to $R_1$, and substantially unaffected by induced fields $B_A$ and $B_B$.

Member 11 may be formed by suitably etching a rectangular, and the like-shaped, member of the chosen conductive material. The meander-line sensed-current element 11c may be shaped by known techniques for selectively etching materials. The resulting sensing-branch resistance $R_2$, as well as the main-branch resistances $R_1$, can be adjusted by changing the cross-sectional area of element 11c, or of at least one of elements 11a or 11b, by removal of conductive material therefrom.

Figure 2A:
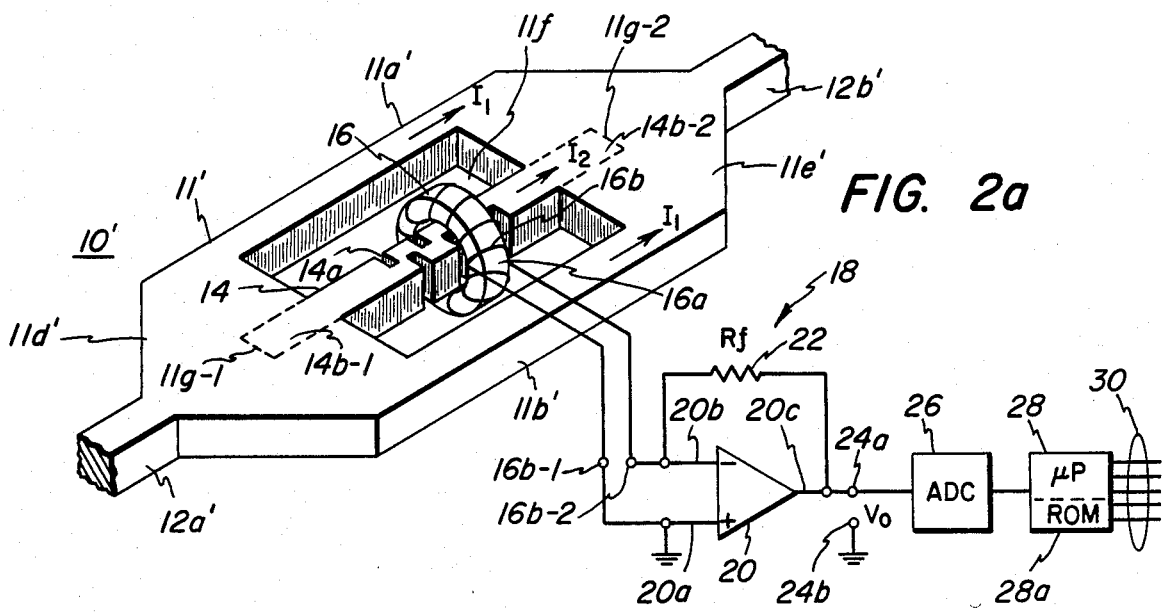
FIG. 2a is a perspective view of another embodiment of the current sensor of the present invention and of an active load terminating circuit and measurement circuit with which the sensor can be used.

Referring now to FIG. 2a, another embodiment 10' of my novel current sensor is illustrated. The member 11' utilized in sensor 10' may have somewhat rectangular bus bar connections 12a' and 12b' thereto and may utilize end portions 11d' and 11e' which are devoid of acutely-angled corners (at which corners corona or other discharge effects may occur in high-voltage, high-current systems). To provide for optimal balancing of induced fields and to allow the resistance of the sensing-branch element to be established, member 11' is formed with a single, generally-rectangular opening 11f therethrough, defining the pair of main-branch elements 11a' and 11b'. Notches 11g-1 and 11g-2 are formed into end portions 11d' and 11e', respectively, along a line substantially parallel to, and substantially centered between, main-branch elements 11a' and 11b'. A separate sensing-branch element 14, of the same material as member 11', is individually fabricated with alternating and complementary slots 14a to define the meander-line geometry desired. After fabrication and optional adjustment of the depth and/or width of slots 14a to yield the desired sensing-branch resistance $R_2$, the opposite ends 14b-1 and 14b-2 of member 14 are placed respectively within slots 11g-1 and 11g-2, which have been suitably sized and spaced for close reception thereof. Ends 14b-1 and 14b-2 are conductively and mechanically joined to member end portions 11d' and 11e', respectively, as by laser welding and the like. This configuration allowed the balancing of induced field contributions along the line-of-elongation of member 14 before member 14 is introduced, by utilization of a field-sensing probe (not shown) positioned along the line between slots 11g-1 and 11g-2. A DC current of convenient amplitude may be caused to flow through member 11', and the relative resistances of branches 11a' and 11b' adjusted for equal induced field contribution into the probe, and therefore of equal current flow (and resistance) in the main-branch elements. Further, the exact resistance of the parallelled main branch elements 11a' and 11b' may also be determined prior to installation of member 14, thereby allowing the sensing-branch resistance $R_2$ to be trimmed prior to installation of member 14 in member 11'. In this manner, sensor 10' can be provided with increased accuracy and freedom of induced-current effects.

The current $I_2$ flowing in sensing-branch member 14 is sensed by a current transformer 16. The transformer utilizes element 14 as a single-turn primary winding, passing through a core 16a upon which a multi-turn secondary winding 16b is wound. Transformer 16 is placed about member 14 prior to the installation and fastening of the latter within slots 11g. Thus, while a split-core transformer (not shown) could be utilized with the embodiment of FIG. 2a, and must be utilized with the embodiment of FIG. 2, a unitary-core transformer can be utilized with embodiment 10'. In many applications, requiring sensing of current over different and varied ranges, a selected one of a number of different transformer assemblies may be utilized, with each different transformer core having a different number of turns on the secondary winding 16b thereof. The range of current sensor 10' is then established by selecting the core with the appropriate number of secondary winding turns, installing that core about a member 14 having a resistance selected from one of several possible resistances (by variation of the number and physical characteristics of slots 14a) within a range of such sensing-branch members and installation of the core 16-member 14 sub-assembly into the main member slots 11g. Suitable means (not shown) of insulating material may be inserted between core 16 and member 14 to suitably fasten the core to the member, resulting in a sensor of high mechanical integrity.

Advantageously, current transformer secondary winding 16b is terminated with an active load termination circuit 18, such as described and claimed in my U.S. Pat. No. 3,815,012, issued June 4, 1974, and incorporated herein by reference in its entirety. Active load termination circuit 18 utilizes an operational amplifier 20, having the non-inverting input 20a thereof connected to electrical ground potential, in parallel with one end 16b-1 of the transformer secondary winding. The remaining transformer secondary winding end 16b-2 is connected to the inverting input 20b of the operational amplifier. A feedback resistance 22, of magnitude $R_f$, is connected between input 20b and operational amplifier output 20c, which output is also connected to one output terminal 24a, at which an output voltage $V_0$ appears with reference to ground potential terminal 24b. Output voltage $V_0$ has a magnitude proportional to the magnitude of feedback resistance $R_f$ and sensing-branch current $I_2$, and inversely proportional to the turns ratio N of transformer 16. As the turns ratio N is the ratio of the number of turns $N_s$ in secondary winding 16 to the number of turns $N_p$ in the transformer primary (branch 14) and as $N_p=1$ for the single turn primary winding, the output voltage $V_0$ magnitude is given by the expression $V_0=R_fI_2/N_s$, or $V_0=R_fKI/N_s$, where K is the current division ratio in sensor 10', previously given as $K=1/(1+2R_2/R_1)$. As an example, if the ratio of $R_2/R_1$ is 49.5, $K=1/100$; if secondary winding 16b has $N_s=1000$ turns, the output voltage $V_0=IR_f/100,000$.

This analog AC output voltage $V_0$ can be directly utilized, or can be converted to digital data by means of an analog-to-digital converter 26 having its input connected to terminal 24a. The ADC digital data can be subsequently provided to a microprocessor 28. The latter configuration is especially useful in that, while a particular embodiment of sensor 10' can have a high degree of linearity, e.g. ±0.2%, over a certain current range, e.g. about 1 ampere to about 50 amperes, self-heating and other effects increase the non-linearities, e.g. to about 2.5%, at some greater current, e.g. about 150 amperes. Data relating to the error magnitude for a particular sensor may be permanently stored in the read-only memory portion 28a of the microprocessor and utilized to correct the actual digital data converted from the sensor analog output to provide digital data, at an output port 30, which is highly accurate over a large range, e.g. of 3 orders of magnitude or more.

Referring now to FIG. 2b, another presently preferred current sensor 10" not only provides induced field compensation, but also provides thermal compensation. Sensor 10' utilizes a generally U-shaped member 40, of copper and the like conductive material. The opposite ends 40a and 40b of member 40 are utilized for connection in the circuit in which AC current I flows. The distance D separating the arms 40-1 and 40-2 of the member is preferably small, and a sheet 42 of insulating material can be placed between the interior-facing surfaces of arms 40-1 and 40-2 to provide electrical insulation therebetween. An aperture 40-1a is formed through upper arm 40-1 and a substantially similar and registered aperture 40-2a is formed through lower arm 40-2. A slot 40-2b is formed completely through the lower arm 40-2 portion from the periphery of aperture 40-2a to the arm edge. The corresponding portion 40-1b in the upper arm acts as a bypass branch and can have a meander-line configuration for increasing the resistance thereof. Thus, at least one slot 40-1c, of position, depth and width selected to achieve a desired resistance, can be formed both from the outer edge of arm 41a partially, but not completely, toward aperture 40-1a, and/or from an edge of aperture 40-1a partially, but not completely, through arm 40-1 toward the outer edge thereof. Generally, the meander-line-forming slots 40-1c will alternately extend from aperture 40-1a and the exterior portion 40-1b. Apertures 40-1a and 40-2a are of suitable shape to facilitate the placement of a multi-piece core 44 therethrough, with the remainder of the core extending about the exterior surface of element 40. Core 44 forms part of a current transformer 46, having a secondary winding 48 formed of a multiplicity $N_s$ of turns of wire about core 44.

The upper arm 40-1 forms a pair of parallelled current-carrying paths, i.e. through portion 40-1b and through the remaining portion 40-1d; as portion 40-1b has a greater resistance than portion 40-1d, the current $I_2$ through portion 40-1b is considerably less than the current $I_1$ flowing in portion 40-1d. As $I_2$ is considerably smaller than $I_1$, current $I_1$ is almost equal to the total sensor current I, which also flows in lower arm portion 40-2d. As the current in portions 40-1d and 40-2d flow in opposite directions, and are of almost equal magnitudes, the fields induced by current $I_1$ and current I substantially compensate for one another in meander-line upper arm portion 40-1b. The transformer 46 now sees a first primary current portion of magnitude I (due to lower arm 40-2) and a second primary current portion of magnitude I-$I_2$ (due to upper arm portion 40-1d), flowing in opposite directions. The difference, or transformer primary current, is $I_2$. This primary current $I_2$ results in a lesser secondary winding current, by a factor equal to the transformer ratio, i.e. $N_s$, the number of secondary winding turns.

The secondary winding ends 48a and 48b are respectively connected to ground potential at the non-inverting input 50a and to the inverting input 50b of an operational amplifier 50. A pair of back-to-back protection diodes 52a and 52b are also connected between the transformer secondary winding ends 48a and 48b. Diodes 52 and operational amplifier 50 form a portion of an active load termination circuit 54 receiving positive and negative supply potentials +V and −V. The operational amplifier output 50c is connected to the anode of a first biasing diode 56a and the cathode of a second biasing diode 56b. The anode of diode 56b is connected to the base electrode of a NPN transistor 58 and to one terminal of a first biasing resistance 60a. The remaining terminal of resistance 60a and the collector electrode of transistor 58 are connected to positive operating potential +V, as is the positive input 50d of the operational amplifier. The cathode of diode 56a is connected to the base electrode of a PNP transistor 62 into one terminal of another biasing resistor 60b. The remaining terminal of resistor 60b and the collector electrode of transistor 62 are connected to negative operating potential −V, as is the negative potential input 50e of the operational amplifier. The emitter electrodes of transistors 58 and 62 are connected together and the common emitter connection is connected both through a feedback resistance 64, of magnitude $R_f$, to operational amplifier input 50b, and to the active load termination circuit output terminal 50a, at which an output voltage $V_0$ appears with respect to ground potential output terminal 54b.

Operation of active load termination circuit 54 is substantially as described hereinabove with respect to circuit 18, but with diodes 52 providing protection in the event that the operational amplifier begins to saturate or if transients and spikes appear at the current transformer output, due to similar phenomena in the current I being measured by sensor 10". Diodes 56, resistors 60 and transistors 58 and 62 form a buffer amplifier for increasing the output current capability of operational amplifier 50, to reduce saturation effects in circuit 54.

The self-heating effect upon meander-line portion 40-1b is substantially compensated for in sensor 10" by the close proximity of arms 40-1 and 40-2. As portion 40-1d heats up, due to the greater power dissipation therein with respect to portion 40-1b, some of the thermal energy from portion 40-1d enters portion 40-1b; a portion of the heat energy from lower arm 40-2 is conducted into portions 40-1c and, because of the close proximity of portions 40-2c and 40-1b, portion 40-1b is further heated thereby. Thus, the temperature of portion 40-1b (and therefore the temperature of equivalent shunting-branch resistance $R_2$) rises substantially proportionally to $(I^2R_1-I^2_1R_1)$. Due to the compensation of both the self-heating effect and the self-induced current effect, magnitude and phase errors over a large current range are minimized in sensor 10". It is therefore possible to provide a single sensor 10" and termination circuit 54 useable over a wide range of currents merely by selection of a proper feedback resistance 64 magnitude $R_f$ (to tailor the sensor output voltage $V_0$ magnitude proportional to $K'IR_f/N_s$, where $K'$ is the current division ratio of sensor 10").

While several presently preferred embodiments of my novel current sensor have been described with some particularity herein, many variations and modifications will now become apparent to those skilled in the art. By way of example, the U-shaped member 40 of sensor 10" need not have flat arm portions 40-1 or 40-2, but may equally as well have arm portions of any desired shape. It is expressly contemplated that arm portions 40-1 and 40-2 may be semicircular complementary portions, whereby member 40 may be formed of a tube of conductive material, having a pair of diametrically-positioned slots cut through a portion, but not completely, along the length thereof, whereby the uncut tubular portion forms the joining, or web, portion 40-3 of the member. Accordingly, I intend to be limited only by the scope of the appending claims and not by the particular details presented by way of example herein.

What is claimed is:

1. Apparatus for sensing the magnitude of a current flowing therethrough, comprising:
a member having a plurality of current-carrying first element portions each having substantially the same resistance $R_1$, and a second current-carrying element portion, coplanar with at least one of said first element portions, having a meander-line geometry and a second resistance $R_2$; each of said first element portion resistance $R_1$ being less than the resistance $R_2$ of said second element portion; said second element portion being electrically connected in parallel with at least one of said first element portions; said plurality of first element portions being arranged to each provide an induced current in the second element portion of magnitude and phase selected to substantially cancel one another; and
means associated with the second element portion for transforming the magnitude of current flowing through said second element portion to a sensor output current related to the total current flowing through said member by the ratio of the second resistance $R_2$ and the first resistance $R_1$.

2. The sensor of claim 1, wherein all of the first element portions are coplanar with each other and with said second element portion.

3. The sensor of claim 2, wherein said first element portions are elongated elements extending substantially parallel to and spaced from one another; and said second element portion is positioned between said spaced-apart first element portions.

4. The sensor of claim 3, wherein said member further includes spaced-apart end portions each integrally joined to associated aligned ends of all of said first and second elements at opposite ends thereof.

5. The sensor of claim 4, further comprising means at each of said end portions for forming an electrical connection thereto.

6. The sensor of claim 1, wherein there are two first element portions.

7. The sensor of claim 1, wherein said transforming means includes a current transformer having said second element portion serving as a primary winding thereof.

8. The sensor of claim 7, wherein said current transformer further includes a core disposed at least about said second element portion; and a secondary winding having a multiplicity $N_S$ of turns disposed about said core.

9. The sensor of claim 8, wherein there are two first element portions and the secondary winding has a current $I_S$ flowing therein related to the total current I flowing through said sensor by the relationship: $I_S=I/N_S(1+2R_2/R_1)$.

10. The sensor of claim 8, further comprising means for actively terminating said secondary winding.

11. The sensor of claim 10, wherein said actively terminating means includes an operational amplifier having first and second inputs connected to first and second ends of said secondary winding, and an output; and a feedback resistance connected between one of said inputs and said outputs and having a magnitude $R_f$ selected to provide a voltage $V_0$ at said output related to the total current I flowing through said sensor by the relationship: $V_0=IR_f/N_S(1+2R_2/R_1)$.

12. The sensor of claim 1, wherein said first element portions are positioned to thermally compensate said second element portion for changes in temperature of said first element portions due to self-heating.

13. The sensor of claim 12, wherein there are a pair of series-connected first element portions; and said second element portion is in electrical parallel connection with only one of said first element portions.

14. The sensor of claim 13, wherein said member is a substantially U-shaped member with one of said first element portions being formed in each of the spaced-apart arms thereof.

15. The sensor of claim 14, wherein said second element portion is formed in one of said arms.

* * * * *